United States Patent [19]

Chandrasekaran et al.

[11] Patent Number: 5,405,731
[45] Date of Patent: Apr. 11, 1995

[54] AQUEOUS PROCESSABLE, MULTILAYER, PHOTOIMAGEABLE PERMANENT COATINGS FOR PRINTED CIRCUITS

[75] Inventors: Karuppiah Chandrasekaran; Mark R. McKeever, both of Sayre; James W. O'Neil, Chadds Ford, all of Pa.

[73] Assignee: E. I. Du Pont de Nemours and Company, Wilmington, Del.

[21] Appl. No.: 993,477

[22] Filed: Dec. 22, 1992

[51] Int. Cl.$^6$ .................. G03C 11/12; G03C 1/90; G03C 1/68
[52] U.S. Cl. ................. 430/260; 430/258; 430/262; 430/263; 430/288; 430/312; 430/910
[58] Field of Search ............. 430/258, 259, 260, 262, 430/263, 312, 288, 910

[56] References Cited

U.S. PATENT DOCUMENTS

| | | | |
|---|---|---|---|
| 3,629,036 | 12/1971 | Isaacson | 430/260 |
| 4,349,620 | 9/1982 | Cyr et al. | 430/258 |
| 4,352,870 | 10/1982 | Howard et al. | 430/312 |
| 4,506,004 | 3/1985 | Sullivan et al. | 430/312 |
| 4,571,374 | 2/1986 | Vikesland | 430/260 |
| 4,698,294 | 10/1987 | Lau et al. | 430/325 |
| 5,248,583 | 9/1993 | Lundquist et al. | 430/263 |
| 5,288,589 | 2/1994 | McKeever et al. | 430/260 |

FOREIGN PATENT DOCUMENTS 1597607  9/1981  United Kingdom .......... G03C 1/68

*Primary Examiner*—Richard L. Schilling

[57] ABSTRACT

The use of a two layer photoimageable, aqueous processable, resist with a hydrophic binder in the outermost layer provides a permanent coating highly resistant to printed circuit processing chemicals. This resistance results in levels of adsorbed or absorbed ionic contamination less than 14 micrograms per square inch.

8 Claims, No Drawings

AQUEOUS PROCESSABLE, MULTILAYER, PHOTOIMAGEABLE PERMANENT COATINGS FOR PRINTED CIRCUITS

FIELD OF THE INVENTION

The present invention is directed towards aqueous processable, photoimageable elements for use as permanent coatings, such as for the protection of printed circuitry, that are comprised of two or more layers to obtain excellent resistance to printed circuit processing chemicals while maintaining an acceptable balance of application and performance properties in a single element.

BACKGROUND OF THE INVENTION

Photopolymerizable resist materials are known to form a resist layer on a substrate, such as a printed circuit board, to allow subsequent processing of the substrate such as selectively etching, electroplating or treatment with solder. The use of a non-photopolymerizable secondary layer, in combination with photosensitive materials such as photopolymerizable resist, is known to enhance particular properties of the photoresist such as surface hardness, phototool release and photosensitivity.

The use of a solvent developable multiple layer photoresist for use in the etching of printed circuit detail is known. U.S. Pat. No. 4,349,620 describes such a photoresist that has improved adhesion, without sacrifice in development latitude, and with reduced film thickness. The use of a two layer photoresist system is disclosed in U.S. Pat. No. 4,352,870. Improved resolution is achieved through the resist layer closer to the substrate having a greater photosensitivity.

Lamination of a photosensitive material onto a substrate employing an intermediate liquid layer is taught in several U.S. Patents using various liquids and application techniques. U.S. Pat. No. 3,629,036 discloses application of a liquid adhering agent, preferably a solvent for a resist containing a small amount of dissolved resist, to a surface of a substrate followed by application of a photosensitive resist film. U.S. Pat. No. 4,069,076 discloses a process for applying a photoresist film to a preimaged pattern relief substrate after flooding the substrate with a solvent or a nonsolvent swelling agent to reduce air entrapment and improve resist conformation. U.S. Pat. No. 4,293,635 discloses application of a photosensitive composition containing an amphoteric interpolymer, for improved cold flow, to a copper surface wetted with a liquid such as ethanol-water solution. U.S. Pat. No. 4,698,294 discloses a process for lamination of a dry film with a lamination liquid, which is substantially all monomer and non-photosensitive, such that adequate conformation and adhesion of the dry film to the circuit board is obtained with no air entrapment.

U.S. Pat. No. 4,506,004 discloses various embodiments of obtaining printed circuit boards more cost effectively by means of a two layer composite coating. In one embodiment an adhesive photopolymer layer is applied to a printed wiring board in a liquid state displacing air from the printed wiring board surface. A dry film solder mask is temporarily adhered to the underside of a screen printing frame and applied onto the liquid layer prior to processing of the photopolymer layer. In another of the embodiments of the patent nonphotoimaging epoxy layers can be employed.

In the use of permanent coatings for printed circuit boards, a combination of storage stability and acceptable end-use properties such as high temperature (solder) resistance, chemical inertness, good cleanability after soldering resulting in low ionic levels, high electrical resistance, low electromigration and good adhesion to raised copper metal reliefs is difficult to achieve. It is expecially difficult to achieve inertness of the surface of the soldermask to water-based printed circuit board process chemicals and have the capability of aqueous development of the coating unexposed to actinic radiation. It would be useful to have a permanent coating with an acceptable balance of the required storage, application and performance properties and particularly useful for the coating to be aqueous processable.

SUMMARY OF INVENTION

The present invention is directed towards an aqueous processable, storage stable, photoimagable permanent coating element having an acceptable balance of application and performance properties which comprises:
(a) a temporary support film;
(b) a first layer of a photopolymerizable permanent coating composition comprising:
(I) a hydrophobic binder; and
(II) a monomeric component containing at least two ethylenically unsaturated groups;
(c) a second layer of a photoimageable permanent coating composition comprising;
(I) a carboxyl containing copolymeric binder, wherein the level of carboxyl groups is determined for a given composition by optimizing the amount needed for good development in aqueous alkaline developer, having the structural units:

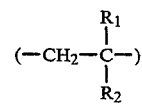

in which:
$R_1$ is H or alkyl;
$R_2$ is phenyl, $CO_2R_3$ or a macromer component; and
$R_3$ is H or alkyl which is unsubstituted or substituted with one or more hydroxy groups,
(II) a monomeric component containing at least two ethylenically unsaturated groups,
(III) a photoinitiator or photoinitiator system, and
(IV) a thermal crosslinking agent,
wherein the first layer is interposed between the support and the second layer.

DETAILED DESCRIPTION OF THE INVENTION

The object of the invention is to provide a permanent coating that can be stored for a useful length of time and have a maximum level of ionic materials of 14 micrograms per square inch, as measured in the Ionics Test described below. A further object is to encapsulate raised relief without air entrapment and to be capable of developing in aqueous 0.85% sodium carbonate solution at 40° C. in about two minutes. The coating is to possess acceptable bulk properties, such as resistance to no-clean solder fluxes, resistance to multiple 500° F. solder exposures for 2-6 seconds, and thermal cycle resistance according to Mil Spec P55110D Thermal Shock 3.9.3 and 4.8.6.3. The coating is to also have acceptable properties at the substrate/coating interface, such as adhesion upon lamination and throughout processing such that no resist lifting occurs, as well as low electromigration per the Institute for Printed Circuits (IPC) Solder Mask 840B Electromigration Test 2.6.14.

This invention provides and overall balance of desireable properties through the utilization of at least two layers of storage stable permanent coatings. The layer of photoimageable permanent exposed to the environment (not laminated to the substrate) contains at least 10 parts by weight of a hydrophobic binder which minimizes the capability of this coating layer to absorb, adsorb or otherwise retain materials that would increase the levels of ionics or decrease it's resistance to these processing chemicals. Hydrophobicity throughout the entire permanent coating would result in poor aqueous development of unexposed coating, coating residues on the copper of the printed circuit and poor solderability. The combination of first and second layers is more effective than a single layer of the same total thickness and entire composition of these multiple layers.

The layer of first photopolymerizable permanent coating composition, which is preferably photoimageable, or simply the first layer, may be adjacent to a support film or a cover film. It is preferred that the first layer be applied by conventional means to the temporary support film from a solution and then dried. The layer of the second photoimageable permanent coating composition, or simply the second layer, may be applied as a solution or a preformed layer to the first layer by conventional means to obtain high adhesion between these layers. Preferably, a cover film is laminated to the bare surface of the second layer so that the first and second permanent coating layers are sandwiched between and protected by the support film and cover film. The photoimageable permanent coating element is storage stable. For purposes of this invention, storage stable is defined as the permanent coating element having the functional properties described above for 24 months when stored at about 20° C. and 50% relative humidity.

The permanent coating can be applied to the circuit board by first removal of the support film and then lamination to the substrate through the cover film or, as is preferred, first removal of the cover film and then lamination to the substrate through the support film. The first layer preferably has a higher adhesion to the temporary support film than does the second layer have to the cover film. Adhesion differences are such that reliable removal of the coversheet can be obtained without lifting or delamination of the first layer from the second layer or without lifting or delamination of the first layer from the temporary support film. The second layer in contact with the substrate surface, usually copper and dielectric material, has high adhesion to the surface as well as to the first layer, such that the support film can be removed without delamination between the coating layers or between the second layer and the substrate.

The combined first and second layers have a similar photospeed as that of the second layer alone and are developable with about the same concentration of aqueous alkaline solution, such as 0.85% by weight sodium carbonate, so that the complete thickness of the first and second layers can be washed away in a single development step to leave a resist image of both layers on the substrate surface.

The thickness of the combination of permanent coating layers will depend on any relief pattern on the substrate surface. Generally, the total thickness will be no greater than 125 microns (5 mils). Preferably, the first layer will comprise 1 to 20% of the combined layer thicknesses.

Temporary Support

Any of the support films known for use as such for a photoresist film can be used in the present invention. The temporary support film, which preferably has a high degree of dimensional stability to temperature changes, may be chosen from a wide variety of polyamides, polyolefins, polyesters, vinyl polymers, and cellulose esters, and may have a thickness of from about 6 to 200 microns. A particularly suitable support film is polyethylene terephthalate having a thickness of about 25 microns. The temporary support film can be treated to improve release properties with substances such as silicone.

In addition to providing a support for the manufacture of the permanent coating, it is also desireable to protect the photoresist laminated to the printed circuit substrate by means, such as the temporary support film, during imaging exposure to prevent blocking between the permanent coating and a phototool.

Permanent Coating Compositions

Of the first layer of polymerizable permanent coating components the preferred ranges are 10 to 40 parts by weight of hydrophobic binder; 0 to 50 parts by weight of copolymeric cobinder containing carboxyl functionality; 10 to 30 parts by weight of monomer; 0 to 10 parts by weight of photoinitiator or photoinitiator system; 0 to 15 parts by weight of thermal crosslinking agent; and 0 to 60 parts by weight of inorganic filler.

Of the second layer of photoimageable permanent coating components the preferred ranges are 30 to 80 parts by weight copolymeric binder containing carboxyl functionality; 20 to 50 parts by weight of monomer; 0.5 to 10 parts by weight of photoinitiator or photoinitiator system; 5 to 25 parts by weight of thermal crosslinking agent; and 0 to 30 parts by weight inorganic filler.

Hydrophobic Binder

The binder component essential to the first layer of the invention is a hydrophobic copolymer made from structural unit A or structural units A and B, wherein A and B have the structure:

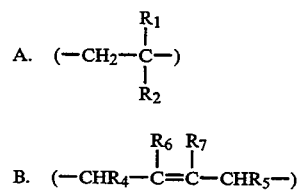

in which $R_1$ is H or alkyl; $R_2$ is phenyl, nitrile, hydroxyl or $CO_2R_3$; $R_3$ is H or alkyl which is unsubstituted or substituted with one or more hydroxy groups; $R_4$, $R_5$, $R_6$ and $R_7$ are independently H or alkyl. The alkyl groups can contain from one to twelve carbon atoms and preferably one to four carbon atoms. Suitable comonomers, which form the structural unit A of the hydrophobic copolymer essential to the first layer of the invention, are styrene and unsaturated carboxylic acids and their derivatives, such as (meth) acrylic acid and (meth) acrylates. Methyl methacrylate, methyl acrylate, ethyl acrylate, butyl acrylate, ethyl methacrylate, hydroxyethyl acrylate, hydroxyethyl methacrylate and acrylonitrile are preferred. Preferred comonomers, which form the structural unit B of the hydrophobic copolymer essential to the first layer of the invention, are butadiene and isoprene.

The hydrophobic copolymer binder is comprised of 30 to 100 parts by weight of structure A and 0 to 70 parts by weight of structure B. A mixture of two or more hydrophobic binders may be used to impart the desired balance of hydrophobicity and other physical properties.

Copolymer Binder

The binder component essential to the second photoimageable layer of the invention, and which may be present as a cobinder in the first layer, is a carboxyl containing copolymer made from structural unit C, wherein C has the structure:

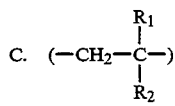

in which $R_1$ is H or alkyl; $R_2$ is phenyl, $CO_2R_3$ or macromer; and $R_3$ is H or alkyl which is unsubstituted or substituted with one or more hydroxy groups. Suitable comonomers, which form the structural unit C of the copolymer essential to the second layer of the invention, are styrene and unsaturated carboxylic acids and their derivatives, such as (meth) acrylic acid and (meth)acrylates. Methyl methacrylate, methyl acrylate, ethyl acrylate, butyl acrylate, ethyl methacrylate, hydroxyethyl acrylate and hydroxyethyl methacrylate are preferred.

A macromer can be incorporated into the copolymer binder, to form a branch polymer segment, during the addition polymerization process of a macromet and a comonomero These copolymer binders can be prepared by any of the addition polymerization techniques known to those skilled in the art, such as described in U.S. Pat. No. 4,273,857. A "macromer" for the purpose of this invention, is a polymer, copolymer or oligomer of molecular weight ranging from several hundred to about 40,000 containing a terminal ethylenically unsaturated polymerizable group. The branched polymer segments or macromers can be any of those derived from ethylenically unsaturated macromers prepared according to the general descriptions in U.S. Pat. Nos. 4,680,352; 4,694,054 and 4,722,984. Illustrative macromers are vinyl polymers, acrylic polymers and copolymers of acrylic monomers and vinyl monomers. Preferred monomer components for use in preparing macromers include: methyl methacrylate, ethyl (meth)acrylate, butyl (meth)acrylate, 2-hydroxyethyl (meth)acrylate, methacrylic acid, acrylic acid and styrene.

Macromers useful in this invention have limited molecular weight and polydispersity. Polydispersity is employed in its conventional sense as the ratio of the weight average molecular weight ($M_W$) to the number average molecular weight ($M_n$), i.e. $M_W/M_n$. Preferably the macromet will have a weight average molecular weight of about several hundred to 40,000 and a $M_W/M_n$ of about 5 or less. Particularly preferred are macromers having a $M_W$ of about 5,000 or less and a $M_W/M_n$ of 3 or less.

The binder copolymers of the invention can be formed by direct copolymerization of one or more ethylenically unsaturated dicarboxylic acid anhydrides with one or more of the comonomers described above. Suitable ethylenically unsaturated dicarboxylic acid anhydrides are, for example, maleic anhydride, itaconic acid anhydride and citraconic acid anhydride. The copolymer binder containing acid anhydride functionality can be reacted with primary aliphatic or aromatic, optionally substituted, amines. Substituents can be the following functional groups: secondary amino, tertiary amino, hydroxy, ester, keto, ether and/or thioether groups. Propyl amine, butyl amine, aminopropanol, aminoethanol, 2-aminophenol, decyl amine, N-methyl-1,2-diaminoethane, N-ethyl-1,2-diaminoethane, N,N-dimethyl-1,2-diaminoethane, N-(2-hydroxyethyl)-2-diaminoethane and cyclohexyl amine are preferred.

When the permanent coating is photoimaged, development of the composition requires that the overall composition of the binder materials should contain sufficient carboxylic acid groups to render both layers of the permanent coating processable in aqueous alkaline developer. The coating layer formed from the element will be removed in portions which are not exposed to radiation but will be substantially unaffected in exposed portions during development by aqueous alkaline liquids such as wholly aqueous solutions containing 0.85% sodium carbonate by weight for a time period of two minutes at a temperature of 40° C. The acid number of the copolymer binder for the first permanent coating layer should preferably be 0 to 50, so as not to render the first layer hydrophylic. The acid number of the copolymer binder for the second photopolymerizable permanent coating layer, which may also be present in the first layer, should be 40 to 160, preferably 60 to 150, to also optimize adhesion to the printed circuit substrate and to ensure developability of the hydrophobic binder of the first layer.

In order to have sufficient conformability and resistance to drastic changes in environmental conditions, the polymer in each layer of the permanent coating is required to have a glass transition temperature less than 90° C.

The proper molecular weight range is required for manufacturing purposes, such as solution viscosity and process latitude, as well as for a proper balance of permanent coating properties, such as toughness and solder resistance. A hydrophobic copolymer binder molecular weight range from about 10,000 to 500,000 is suitable. The preferred range is from about 15,000 to 100,000. A copolymer binder molecular weight range from about 25,000 to 500,000 is suitable. The preferred range is from about 40,000 to 250,000.

The quantity of total hydrophobic copolymer binder present in the first coating layer is 10 to 40 parts by weight relative to the total components of the first layer. The quantity of total copolymer binder in the second coating layer is generally 30 to 80 parts by weight relative to the total components. The copolymer binder may be present as a cobinder in the first layer up to 50 parts by weight relative to the total components of the first layer.

Monomer

The momomer provides the capability of the permanent coating composition to photopolymerize and contributes to overall properties. In order to effectively do so, the monomer should contain at least two ethylenically unsaturated groups capable of undergoing polymerization on exposure to actinic radiation when incorporated in the permanent coating element. Excessive amounts of trifunctional acrylate monomers can result in reduction of required flexibility. For purposes of this invention, it is desireable to have a relatively lower level of monomer concentration in the first permanent coating layer in order to insure that adhesion of the first layer to the support film is not excessive.

Suitable monomers which can be used as the sole monomer or in combination with others include acrylate and methacrylate derivatives of alcohols, isocyanates, esters, epoxides and the like. Examples are diethylene glycol diacrylate, trimethylolpropane triacrylate, pentaerythritol triacrylate, polyoxyethylated and polyoxypropylated trimethylolpropane triacrylate and trimethacrylate and similar compounds as disclosed in U.S. Pat. No. 3,380,831, di-(3-methacryloxy-2-hydroxypropyl) ether of tetrachloro-bisphenol-A, di-(2-methacryloxyethyl) ether of tetrachloro-bisphenol-A, di-(3-methacryloxy-2-hydroxypropyl) ether of tetrabromo-bisphenol-A, di-(2-methacryloxyethyl) ether of tetrabromo-bisphenol-A, triethylene glycol dimethacrylate, trimethylol propane triacrylate, polycaprolactone diacrylate, and aliphatic and aromatic urethane oligomeric di(meth)acrylates from Sartomer, West Chester, Pa.

A particularly preferred class of comonomers is hexamethylene glycol diacrylate, triethylene glycol diacrylate, tripropylene glycol diacrylate, trimethylolpropane triacrylate, polyoxyethylated trimethylolpropane triacrylate, polypropoxylated trimethylol propane triacrylate, pentaerythritol tri-and tetracrylate, bisphenol A diacrylate, di-(3-acryloxy-2-hydroxypropyl) ether of bisphenol-A, di-(3-acryloxy-2-hydroxypropyl) ether of tetrabromo-bisphenol-A, or methacrylate analogues thereof.

The quantity of total monomer is generally 10 to 30 parts by weight relative to the total components of the first permanent coating layer, whereas the quantity of total monomer for the second photoimageable permanent coating layer is generally 20 to 50 parts by weight relative to the total components of the second layer.

Photoinitiator Systems

The photoinitiator system has one or more initiator compounds that directly furnish free-radicals when activated by actinic radiation. The system also may contain a sensitizer that is activated by the actinic radiation, causing the initiator compound to furnish the free-radicals. The sensitizer may extend spectral response into the near ultraviolet, visible, and near infrared spectral regions.

Numerous conventional photoinitiator systems are known to those skilled in the art and may be used provided they are compatible with the other ingredients of the coating composition. A large number of free-radical generating compounds, including redox systems such as Rose Bengal/2-dibutylaminoethanol, may be selected to advantage. A useful discussion of dye sensitized photopolymerization can be found in "Dye Sensitized Photopolymerization" by D. F. Eaton in *Adv. in Photochemistry*, Vol. 13, D. H. Volman, G. S. Hammond, and K. Gollinick, eds., Wiley-Interscience, New York, 1986, pp. 427–487.

Sensitizers useful with photoinitiators include methylene blue and those disclosed in U.S. Pat. Nos. 3,554,753; 3,563,750; 3,563,751; 3,647,467; 3,652,275; 4,162,162; 4,268,667; 4,351,893; 4,454,218; 4,535,052; and 4,565,769. A preferred group of sensitizers include the bis(p-dialkylaminobenzylidene) ketones disclosed in Baum et.al., U.S. Pat. No. 3,652,275, and the arylidene aryl ketones disclosed in Dueber, U.S. Pat. No. 4,162,162.

Preferred photoinitiator systems are 2,4,5-triphenylimidazolyl dimers in combination with chain transfer agents, or hydrogen donors, such as are disclosed in U.S. Pat. Nos. 3,479,185; 3,784,557; 4,311,783; and 4,622,286. Preferred hexaarylbiimidazoles (HABI) are 2-orthochlorosubstituted hexaphenylbiimidazoles in which the other positions on the phenyl radicals are unsubstituted or substituted with chloro, methyl or methoxy. The most preferred initiator is ortho-Cl-HABI, i.e., 1,1'-biimidazole, 2,2'-bis (ortho-chlorophenyl) -4,4', 5 5'-tetraphenyl-imidazole dimer.

Hydrogen donor compounds that function as chain transfer agents in the photopolymer compositions include: 2-mercaptobenzoxazole, 2-mercaptobenzothiazole, 4-methyl-4H-1,2,4-triazole-3-thiol, etc.; as well as various types of compounds, e.g., (a) ethers, (b) esters, (c) alcohols, (d) compounds containing allylic or benzylic hydrogen, (e) acetals, (f) aldehydes, and (g) amides disclosed in column 12, lines 18 to 58 of MacLachlan U.S. Pat. No. 3,390,996. Suitable hydrogen donor compounds for use in systems containing both biimidazole type initiator and N-vinyl carbazole are 5-chloro-2-mercaptobenzothiazole; 2-mercaptobenzothiazole; 1H-1,2,4-triazole-3-thiol; 6-ethoxy-2-mercaptobenzothiazole; 4-methyl-4H-1,2,4-triazole-3-thiol; 1-dodecanethiol; and mixtures thereof.

A particularly preferred class of photoinitiators and photosensitizers are benzophenone, Michler's ketone, ethyl Michler's ketone, p-dialkylaminobenzaldehydes, p-dialkylaminobenzoate alkyl esters, polynuclear quinones, thioxanthones, hexaarylbiimidazoles, cyclohexadienones, benzoin, benzoin dialkyl ethers, or combinations thereof where alkyl contains 1 to 4 carbon atoms.

The total photoinitiator or photoinitiator system in the first permanent coating layer is 0 to 10 parts by weight based on the total weight of the components in the first layer. It is not required that the first layer contain photoinitiator, but it is preferred. The total photoinitiator or photoinitiator system in the second photoimageable layer is 0.5 to 10 parts by weight based on the total weight of the components in the second layer.

Thermal Crosslinking Material

When a photoimageable coating is to be used as a permanent resist, such as a solder mask, a chemically or thermally activated crosslinking agent may be incorporated to improve mechanical, chemical or solder resistance properties. Suitable crosslinking agents useful in the present invention are those in the prior art and include those disclosed in Iimure, U.S. Pat. No. 4,961,960 as well as those disclosed in Gervay, U.S. Pat. No. 4,621,043 and Geissler et al., U.S. Pat. No. 4,438,189, such as an adduct of a polyisocyanate compound and an isocyanate group-blocking agent, and formaldehyde condensation resins with melamines, ureas, benzoguanamines and the like.

An adduct of a polyisocyanate and an isocyanate-group blocking agent is a suitable crosslinking material for both the first and second photoimageable coating layers. To assure a proper degree of crosslinking with the reactive functionality, the isocyanate must by definition contain at least two isocyanate functional groups. Preferably the polyisocyanate will contain from two to five, most preferably two or three isocyanate functional groups, in the molecule.

Suitable polyisocyanates are those known in the art and include hexamethylene diisocyanate, the 1,3-, and 1,4-phenylene diisocyanates, the 2,4, and 2,6-toluene diisocyanates, the 1,3-, and 1,4-xylylene diisocyanates, bis(4-isocyanatocyclohexyl)methane, isophorone diisocyanate, and similar polyisocyanates. The preferred polyisocyanate in the present invention is the cyclic trimer of hexamethylene-1,6-diisocyanate and derivatives thereof.

Various isocyanate group-blocking agents are known in the art and are suitable for reaction with the above isocyanate compounds to provide the thermal crosslinking agent used in this invention. These include secondary or tertiary alcohols such as isopropanol and tertiary butanol, lactams such as e-caprolactam, phenols, such as phenol, chlorophenol, cresol, p-tert.-butylphenol, p-sec.-butylphenol, p-sec.-amylphenol, p-octylphenol, and p-nonylphenol, heterocyclic hydroxyl compounds such as 3-hydroxypyridine, 8-hydroxyquinoline, 8-hydroxyquinaldine and the like. Active methylene compounds such as dialkyl malonate, acetylacetone and alkyl acetoacetate oximes such as acetoxime, methyl ethyl ketoxime and cyclohexanone oxime are preferred blocking agents for the polyisocyanates used in this invention.

The most preferred polyisocyanate for use in the present invention is the cyclic trimer of hexamethylene-1,6-diisocyanate completely blocked with methyl ethyl ketoxime, available from Miles as Desmodur® BL3175A.

Aldehyde condensation products, or resin precursors, are also suitable thermal crosslinking agents for the first coating layer and the second photoimageable coating layer of the present invention. Stability of an aldehyde condensation resin precursor in the presence of an acid binder is important for the shelf life stability of the composition. A binder having an acid number of at least 45 and a pKa value of at least 5, measured in 1:1 volume ratio of methanol to water, will not react in a short time period to form the crosslinkable aldehyde resin at a temperature significantly lower than 120° C.

Since a thermal cure is necessary for the reaction to proceed, extended storage time can be obtained for the photosensitive permanent coating element. In addition it is possible to laminate the film to a support at a temperature of 120° C. or lower without initiating the thermal cure reaction between the acid binder and the aldehyde condensation product.

Examples of suitable crosslinking compounds include: N- methylol compounds of organic amides such as: N,N'-dimethylolurea, N,N'-dimethylolmalonamide, N,N'-dimethylolsuccinimide, trimethylolmelamine, tetramethylolmelamine, hexamethylolmelamine, N,N'dimethylolterephthalamide, and C-Methylol compounds of phenols, phenol-ethers and aromatic hydrocarbons 2,4,6- trimethylolphenol, 2,6-dimethylol-4-methyloanisole, and 1,3-dimethylol-4,6-diisopropylbenzene.

Instead of the aforementioned methylol compounds, it is also possible to use, for example, the corresponding methyl, ethyl or butyl ethers, or esters of acetic acid or propionic acid. Preferred examples of methylol ethers are those from formaldehyde condensation products with melamines and ureas. Particularly preferred choices for the second photoimageable coating layer are hexamethoxymethyl-melamine and the butyl ether of the formaldehyde condensation product with melamine.

The quantity of thermal crosslinking agent is generally 0 to 15 parts by weight relative to the total components of the first permanent coating layer, whereas the thermal crosslinking agent for the second photoimageable layer is generally 5 to 25 parts by weight relative to the total components of the second coating layer.

Optional Materials or Additives

Cover Film

In conventional photoresist elements it is necessary or at least highly desireable to protect the photosensitive layer by a removable cover film in order to prevent blocking when it is stored in roll form.

The protective cover film may be selected from the same group of high polymer films described for the temporary support film, supra, and may have the same wide range of thicknesses. However, it is preferable to use a cover film that is relatively flexible. A cover film of 15–30 microns thick polyethylene or polypropylene is especially suitable.

Fillers

The permanent coating compositions may contain inorganic particulates to modify the mechanical or chemical properties required during its processing or end use. Suitable fillers include inorganic reinforcing agents which are essentially transparent as disclosed in U.S. Pat. No. 2,760,863, inorganic thixotropic materials as disclosed in U.S. Pat. No. 3,525,615, microcrystaline thickeners as disclosed in U.S. Pat. No. 3,754,920, finely divided powders having a particle size of 0.5 to 10 micrometers as disclosed in U.S. Pat. No. 3,891,441, and the binder-associated, transparent, inorganic particles as disclosed in European Patent Application 87113013.4. The inorganic filler can be surface treated, such as with amino-silane to enhance end-use properties. Typically, the filler will be transparent to actinic radiation to preclude adverse effects during imaging exposure. Depending on its function in the photopolymerizable composition, the filler may be colloidal or have a nominal particle size of 0.5 micrometers or more in diameter.

The inorganic filler may be present in the first, second or both permanent coating layers in the ranges of 0 to 50 parts by weight of the permanent coating first layer composition and 0 to 30 parts by weight of the second layer.

Other Components

Other compounds conventionally added to photopolymer compositions may also be present in the permanent coating to modify the properties of the coating solution or physical properties of the film. Such components include: adhesion promotors, thermal stabilizers, colorants such as dyes and pigments, viscosity control agents, coating aids, wetting agents, release agents, elastomers and the like.

The permanent coating composition may contain a heterocyclic or mercaptan compound to improve adhesion of the coating to the metal circuit pattern during processing or in the end-use product. Suitable adhesion promotors include heterocyclics such as those disclosed in Hurley et al., U.S. Pat. No. 3,622,334, Jones, U.S. Pat. No. 3,645,772, and Weed, U.S. Pat. No. 4,710,262.

A particularly useful additive is polyvinyl pyrrolidone or copolymers, such as with vinyl acetate. Amphoteric interpolymers such as described in U.S. Pat. No. 4,293,635 are also useful. These materials improve the coatability of coating solutions while improving storage stability of a dry film through an increase in creep viscosity, which corresponds to lower cold flow.

Examples of thermal polymerization inhibitors that can be used in the permanent coating compositions are: Irganox®1010, p-methoxyphenol, hydroquinone, and alkyl and aryl-substituted hydroquinones and quinones, tert.butyl-catechol, and the nitroso compositions disclosed in U.S. Pat. No. 4,168,982 and substituted hydroxylamine disclosed in U.S. 4,298,678.

Various dyes and pigments may be added to increase the visibility of the resist image. Any colorant used, however, should preferably be transparent to the actinic radiation.

Process Steps

The process of the invention is a secondary imaging process to make permanent coatings, i.e., a solder mask, to protect the printed circuit during subsequent processing, primarily solder operations, and/or from environmental effects during use. Permanent coatings also are used as intermediate insulative layers, with or without development, in the manufacture of multilayer printed circuits.

In practice, a photoimageable, permanent coating layer, generally between 10 and 125 micrometers (0.4 and 5 mils) thick, is applied to a printed circuit substrate which typically has a printed circuit relief pattern on a substrate that is semi-rigid, such as fiberglass reinforced epoxy, or on a flexible film substrate based on polyimide or polyester film. The applied photoimageable, permanent coating layer is then imagewise exposed to actinic radiation to harden or insolubilize exposed areas. Any unexposed areas are then completely removed typically with an alkaline, aqueous sodium or potassium carbonate developer solution which selectively dissolves, strips or otherwise disperses the unexposed areas without adversely affecting the integrity or adhesion of the exposed areas. The developed permanent resist image is treated to further cure or harden it by baking at elevated temperatures, such as one hour at 150° C., by additional uniform exposure to actinic radiation or a combination thereof to produce a circuit board having a cured permanent resist layer covering all areas except pad or through-hole areas. Electrical components are inserted into the through-holes or positioned on surface mount pads and soldered in place to form the packaged electrical assembly.

The photoimageable permanent coating may be applied to a printed circuit substrate either as a pre-formed dry film, or as a dry film in combination with a liquid that can be photosensitive.

Dry Film Lamination

Typically, when a dry film is laminated to a printed circuit substrate having a circuit relief, measures must be taken to eliminate entraped air, e.g., from around circuit lines. Entraped air is eliminated by the conventional vacuum lamination, which is an acceptable means of applying the preferred multilayer permanent coating element of this invention to a printed circuit substrate. A photoinitiator or photoinitiator system is present in the first coating layer in the conventional lamination process. This process consists of laminating an aqueous processable, storage stable, photoimageable permanent coating element having a temporary support film, a first permanent coating layer with a first and second surface, a second permanent coating layer with a first and second surface, and a cover film, wherein one surface of the first permanent coating layer is adjacent to the support film, one surface of the second permanent coating layer is adjacent to the cover film and the combined permanent coating layers are interposed between the support film and the cover film, to a printed circuit substrate which comprises the steps of:

(1) removing the cover film from the surface of the second permanent coating layer;

(2) positioning the uncovered second permanent coating layer surface of the permanent coating element adjacent to a printed circuit surface, while the first permanent coating layer surface of the element has adhered thereto the support film;

(3) reducing the absolute gas pressure to less than one atmosphere in the region between the printed circuit surface having raised circuit relief areas and the surface of the second layer of the permanent coating element;

(4) applying pressure to the entire surface of the support film of the permanent coating element at once, whereby the photoimageable permanent coating is forced into intimate contact with the surface having raised circuit relief areas, whereby the raised relief on the substrate is encapsulated with the permanent coating; and (5) trimming the excess permanent coating element from the substrate.

In place of a conventional vacuum laminator, a lamination system such as that disclosed in U.S. Pat. No. 4,698,294 is preferably employed. A lamination liquid is used to displace air during the lamination procedure. It is preferable for the liquid to be capable of becoming a part of the permanent coating after a cure step. The lamination process in the preferred case consists of:

(1) applying to a substrate surface a liquid, (2) removing the cover film from the permanent coating element, (3) laminating the permanent coating dry film to the liquid wetted substrate by passing this combination through a nip of heated, pressurized, rubber rolls, (4) trimming the excess permanent coating film, and, if required, (5) rinsing the excess lamination liquid from the substrate and drying the substrate.

The permanent coating dry film, in combination with the lamination liquid, must adhere to the substrate such that it is functional throughout the lamination process as well as for subsequent process steps and in the intended end-use.

With a planar or substantially planar substrate both low and high viscosity liquids can be employed although a high viscosity liquid will generally take more time to apply. Also high viscosity liquids have a tendency to trap air which is undesirable. However, for substrates which have a raised relief, relatively low viscosity liquids are preferred particularly due to the need to remove air which can be entrapped. Generally the viscosity of the liquid in such a case will not be greater than 400 centipoise and more preferably not greater than 200 centipoise. A most preferred range of viscosity is from 5 to 50 centipoise. Typically the raised relief will be at least 18 microns (0.7 mils) with typical circuit heights ranging from 36 to 100 microns (1.4 to 4.0 mils) and higher.

The lamination liquid should preferably be a composition which is capable of forming a high polymer by photoinitiated polymerization of monomer. The compound called monomer herein is nongaseous and ethylenically unsaturated containing at least one terminal ethylenic group with a boiling point above 100° C. at normal atmospheric pressure. A preferred class of monomers has at least two terminal ethylenic groups. It is not required that the liquid contain a photoinitiator or photoinitiator system, but it is preferred. Representative of these components would be those conventionally used in the photoimageable resist art. The liquid should be substantially free of polymeric materials such as binder, which is an essential component of photoimageable dry film. If a monomer ingredient of the lamination liquid has an unduly high viscosity, a combination of monomers can be used, e.g., high and low viscosity monomers. A suitable type and amount of a diluent conventionally used in the photoresist art can also be used for effective viscosity control.

The photopolymerizable compounds which can be used in the lamination liquid are varied and can be selected from monomers formulated to be a portion of the photoimageable permanent coating composition. Preferred monomers are: tripropylene glycol diacrylate, tetraethylene glycol dimethacrylate, trimethylolpropane triacrylate, pentaerythritol triacrylate, polyethoxylated and polypropoxylated trimethylolpropane triacrylate, polyethoxylated phenol monoacrylate, polyethoxylated bisphenol-A diacrylate, neopentyl glycol propolylate diacrylate, and polyamine acrylate (from Henkel Corporation, Ambler, Pa.). Combinations of monomers and solvents can be employed to optimize adhesion properties of the combined lamination liquid and photopolymerizable coatings to the printed circuit substrate.

Permanent Coating Testing

Ionics Test

Test specimens were prepared from 5½ in. ×5½ in. double-sided glass/epoxy circuit boards laminated with the test permanent coating composition. The laminated specimens were imaged, developed and cured by a single or a double exposure to actinic radiation of 0–8 joules/square centimeter exposure followed by a 1 hour bake at 300° F. Test specimens were soldered per the sequence below:

1) Hot air solder leveled two times with Avalite flux at 5 seconds per dip and with 500° F. solder.

2) Defluxed in conveyorized water rinse, aqueous deflux containing 5% Alpha 2110 saponifier at 150° F., water rinse, water rinse and dry sequence.

3) Wave soldered with Alpha 611 flux at 4 feet/minute at a solder temperature of 550° F.

4) Defluxed as in 2 above.

Ionic surface contamination was then measured as described in IPC-SM-840B, TM-2.3.26.1, Ionizable Detection of Surface Contaminants (Static Method). This method involves extracting contaminants from the surfaces of the test panel in a 75/25 mixture of isopropanol and distilled water. After a 15 minute extraction, the increase in conductivity is measured and converted to a micrograms of sodium chloride equivalent per square inch of board surface (microg/in$^2$). The lower the number, the cleaner the board. Various specifications exist, for example the Military require 14 microg/in$^2$ or less, and the Bellcore telecommunications specification is 6.45 microg/in$^2$ or less.

EXAMPLES

To further substantiate the invention, the examples below are provided. All coating were made onto polyethylene terephthalate support film and matte polyethylene used as cover film, unless otherwise noted. All component figures are given on a weight percent of total composition basis. Materials used for the examples are:

| Binders and Cobinders | |
|---|---|
| Hycar ® 1472 × 26 | Methacrylic acid/butadiene/acrylonitrile (5/70/25) from Zeon-Nippon, Cleveland, OH |
| Joncryl ® 587 | Hydroxylated styrene acrylic copolymer from Johnson Wax |
| Joncryl ® 569 with | Hydroxylated acrylic polymer Mn = 1300, acid number of 3 and hydroxyl number of 140 from Johnson Wax |
| Carboset ® Resin I | Ethylacrylate/ethylmethacrylate/methacrylic acid (60/29/11) with Mw = 150,000, acid number = 80 and Tg = 350 from B.F. Goodrich, Cleveland, OH. |
| Carboset ® Resin II | Ethyl acrylate/ethylmethacrylate/methacrylic acid (25/67.5/7.5) with Mw = 217,000, acid number = 59, Tg = 59° C., from B. F. Goodrich. |
| Elvacite ® 2628 | Ethylacrylate/ethyl methacrylate/methacrylic acid (48/40/12) copolymer from DuPont, Wilmington, DE, with Tg = 35° C. |
| Monomers | |
| TMPTA | Trimethylolpropane triacrylate |
| PETA | Pentaerythritol triacrylate |
| TRPGDA | Tripropyleneglycol diacrylate |
| Ebecryl ® 3704 | Diacrylate of bisphenol-A diglycidyl ether from Radcure, Atlanta, GA |
| Initiators | |
| Irgacure ® 369 1-butanone | 2-Benzyl-2-N,N-dimethylamino-(4-morpholinophenyl)-1- from Ciba Geigy |
| EMK | Ethyl Michler's ketone |
| EDAB | Ethyl p-diethy aminobenzoate |
| Thermal Crosslinking Agents | |
| Cymel ® 303 | Hexamethoxymethyl-melamine from American Cyanamide, Wayne, NJ |
| Fillers | |
| Cyprubond ® | 1% Aminosilane treated silicate from Cyprus Minerals, Englewood, CO |
| Silica MS-7 | Fumed silica |
| Adhesion Promoters | |
| 3 MT | 3-Mercapto-1H-1,2,4-triazole |
| Other ingredients | |
| DEHA | N,N-Diethyl hydroxylamine |
| Dayglo ® 122-9655 | Green and yellow dye in a carrier from Dayglo Corp., Cleveland, OH |
| Value Green 122-9693 | Green dye in a carrier from Dayglo |
| Amphomer ® | Methyl methacrylate/t-octylacrylamide/acrylic acid/hydroxypropyl methacrylate/t-butylamino methacrylate (35/40/16/5/4) from National Starch, Bridgewater, NJ |
| PVP-K-90 | Polyvinylpyrrolidone from GAF Chemicals Corp., Texas City, TX |

Soldermask Processing

Soldermask processing conditions are as follows:

Exposure of all examples is between 100 and 300 mj/cm$^2$. Development conditions are 105° F. and 20 to 50 seconds in aqueous 0.85% sodium carbonate at 20 to 30 psi spray pressure. The cure for all examples is exposure to uv radiation of 2 to 8 joules followed by a thermal cure of 150° C. for one hour, or in the reverse sequence.

Example 1

| Ingredient | Permanent Coating | | | |
|---|---|---|---|---|
| | 1-A | 1-B | 1-C | 1-D |
| Carboset Resin II | 60 | 60 | — | — |
| Elvacite ® 2628 | — | — | 60 | 60 |
| Hycar 1472 × 26 | 25 | 25 | 25 | 25 |
| PETA | 5 | — | 5 | — |
| Ebecryl 3704 | — | 5 | — | 5 |
| Benzophenone | 2.5 | 2.5 | 2.5 | 2.5 |
| EMK | 0.125 | 0.125 | 0.125 | 0.125 |

| Ingredient | 1-E |
|---|---|
| Cyprubond ® | 15 |
| Carboset ® Resin I | 36.9 |
| PETA | 12.8 |
| TMPTA | 12.8 |
| Cymel 303 | 10.6 |
| Benzophenone | 3.4 |
| EMK | 0.3 |
| EDAB | 1.5 |
| DEHA | 0.04 |
| 3-MT | 0.17 |
| Dayglo 122-9655 | 2.55 |
| Amphomer ® | 1.7 |
| PVP K-90 | 2.55 |

All coatings were from an 8% methanol/92% methylene chloride solvent system. Solutions 1-A to 1-D were coated to about 2 microns dry film thickness. Onto these were coated 1-E to about 3 mils dry film thickness. The permanent coatings were vacuum laminated in a conventional manner to test printed circuit boards and then fully processed in accordance with the standard soldermask processing conditions above. The test specimens were then subjected to the above Ionics Test.

| Test Specimen | Ionics (microg/in$^2$) |
|---|---|
| 1-A + 1-E | 13.5 |
| 1-B + 1-E | 12.2 |
| 1-C + 1-E | 13.5 |
| 1-D + 1-E | 12.2 |
| 1-E (single layer) | 17.0 |

Example 2

| Ingredient | Permanent Coating | |
|---|---|---|
| | 2-1 | 2-2 |
| Hycar 1472 × 26 | 1.5 | 25 |
| Joncryl ® 587 | | 60 |
| PETA | 8 | |
| TMPTA | 8 | |
| Cymel 303 | 12.5 | |
| Ebecryl 3704 | 14 | 12.5 |
| Benzophenone | 4 | 2.5 |
| EMK | 0.18 | 0.125 |
| DEHA | 0.05 | |
| 3-MT | 0.2 | |
| Dayglo 122-9655 | 0.5 | |
| Dayglo 122-9693 | 3 | |
| Elvacite EP-2628 | 43.47 | |
| Amphomer ® | 2 | |
| PVP K-90 | 2.6 | |

The first photoimageable coating layer, 2-2, was coated from an 8% methanol/92% methylene chloride solvent system to about 1 to 2 microns. On top of this was coated the second photoimageable layer, 2-1, from the same solvent system to about 2 mils dry thickness. A 2 mil dry film coating was made from 2-1 alone as a control. The coatings were then laminated to test printed circuit boards by the preferred lamination method above, with TRPGDA as the lamination liquid. The boards were exposed to a Stouffer step 10, developed in 1% Na2CO3 solution, and cured at 4 Joules/cm$^2$ followed by a 1 hour bake at 300° F. Boards were soldered as described above and ionics were measured by the above Ionics Test.

| Test Specimen | Ionics (microg/in$^2$) |
|---|---|
| 2-1 (single layer) | 19.2 |
| 2-2 + 2-1 | 12.5 |

Example 3

| Ingredient | Permanent Coating 3-1 |
|---|---|
| Joncryl ® 587 | 53.3 |
| Ebecryl ® 3704 | 11.1 |
| Cymel ® 303 | 11.1 |
| Hycar ® 1472 × 26 | 22.2 |
| Benzophenone | 2.2 |
| EMK | 0.11 |

The first photoimageable permanent coating layer 3-1 was coated from 8% methanol/92% methylene chloride solvent system along with 2-1 from Example 2 as the second photoimageable coating layer. 3-1 was coated as the first layer to 0.0, 0.8, 1.5 and 3.0 micron dry film thicknesses and 2-1 was coated as the second layer to about 2-mils dry film thickness. 2-1 was also coated as a single layer as a control. The coatings were laminated to printed circuit boards and processed through the Ionics Test as in Example 2 above.

| Test Specimens | Layer 3-1 Thickness (microns) | Ionics (microg/in$^2$) |
|---|---|---|
| 2-1 (single layer) | 0.0 | 13.3 |
| 3-1 + 2-1 | 0.8 | 7.0 |
| 3-1 + 2-1 | 1.5 | 7.4 |
| 3-1 + 2-1 | 3.0 | 7.7 |

Example 4

| Ingredient | Permanent Coating | |
|---|---|---|
| | 4-1 | 4-2 |
| Joncryl ® 569 | 54 | 54 |
| Hycar ® 1472 × 26 | 22 | 22 |

-continued

| Ingredient | Permanent Coating | |
|---|---|---|
| | 4-1 | 4-2 |
| Ebecryl ® 3704 | 11 | 11 |
| Cymel(g) 303 | 11 | 11 |
| Benzophenone | 2 | 2 |
| EMK | 0.1 | 0.1 |
| Silica MS-7 | — | 10 |

4-1 and 4-2 were separately coated as the first photoimageable permanent coating layer from an 8% methanol/92% methylene chloride solvent system to form 1 to 2 microns dry film thickness. Onto these were coated the 2-1 permanent coating from Example 2, but with the Amphomer removed, as the second photoimageable layer to form about 2 mils dry film thickness; a single layer was also coated as a control. The permanent coatings were laminated to test printed circuit boards and processed as in Example 2 above through the Ionics Test.

| Test Specimens | Ionics (microg/in$^2$) |
|---|---|
| 2-1 (single layer) | 13.2 |
| 4-1 + 2-1 | 3.8 |
| 4-2 + 2-1 | 4.9 |

Example 5

| Ingredient | Permanent Coating | |
|---|---|---|
| | 5-1 | 5-2 |
| Joncryl ® 587 | 60 | 60 |
| Hycar ® 1472 × 26 | 25 | 12.5 |
| Ebecryl ® 3704 | 12.5 | 25 |
| Benzophenone | 2.5 | 2.5 |
| EMK | 0.125 | 0.125 |

Permanent coatings 5-1 and 5-2 were separately coated as the first photoimageable layer from 8% methanol/92% methylene chloride to about 1 micron dry thickness. Onto each of these was coated as the second photoimageable layer 2-1 from Example 2, but with the Amphomer removed, to a dry film thickness of 2 mils; a single layer was also coated as a control. The coatings were then laminated to test printed circuit boards by the preferred lamination method above, with TRPGDA as the lamination liquid. The boards were exposed to a Stouffer step 10, developed in 1% Na2CO3 solution, and cured at 2 Joules/cm$^2$ followed by an additional 3 Joules/cm$^2$ and then a thermal cure of 1 hour at 300° F.

| Test Specimens | Ionics (microg/in$^2$) |
|---|---|
| 2-1 (single layer) | 17.5 |
| 5-1 + 2-1 | 5.6 |
| 5-2 + 2-1 | 11.4 |

Example 6

| Ingredient | Permanent Coating | |
|---|---|---|
| | 6-1 | 6-2 |
| Joncryl ® 587 | 53 | 53 |
| Hycar ® 1472 × 26 | 21.2 | — |

-continued

| Ingredient | Permanent Coating | |
|---|---|---|
| | 6-1 | 6-2 |
| Ebecryl ® 3704 | 10.6 | 21.2 |
| Cymel φ 303 | 10.6 | 21.2 |
| Benzophenone | 4.2 | 4.2 |
| EMK | 0.2 | 0.2 |

Permanent coatings 6-1 and 6-2 were separately coated to about 1 micron dry thickness from 8% methanol/92% methylene chloride solvent system. Onto these were coated the permanent coating 2-1 from Example 2 to about 2 mils dry film thickness; a single layer was also coated as a control. The permanent coatings were laminated and processed as in Example 5 and then subjected to the Ionics Test.

| Test Specimens | Ionics (microg/in$^2$) |
|---|---|
| 2-1 (single layer) | 15.8 |
| 6-1 | 3.8 |
| 6-2 | 11.1 |

What is claimed is:

1. An aqueous processable, storage stable, photoimageable permanent coating element capable of withstanding molten solder after cure, which comprises in order:

(a) a temporary support film;

(b) a first layer of a polymerizable permanent coating composition comprising:

(I) a hydrophobic binder consisting essentially of structural units A, structural units B or structural units A and B of the formula:

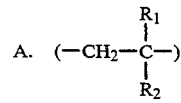

A.  $(-CH_2-\underset{R_2}{\overset{R_1}{C}}-)$

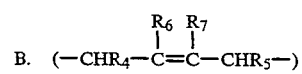

B.  $(-CHR_4-\underset{}{\overset{R_6}{C}}=\underset{}{\overset{R_7}{C}}-CHR_5-)$ in which:
R$_1$ is H or alkyl;
R$_2$ is phenyl, nitrile, hydroxyl or CO2R3;
R$_3$ is H or alkyl which is unsubstituted or substituted with one or more hydroxy groups, and
R$_4$, R$_5$, R$_6$ and R$_7$ are independently H or alkyl; and (II) a monomeric component containing at least two ethylenically unsaturated groups;

(c) a second layer of a photoimageable permanent coating composition comprising:

(I) a carboxyl containing copolymeric binder, wherein the level of carboxyl groups is determined for a given composition by optimizing the amount needed for good development in aqueous alkaline developer, having structural units of the formula:

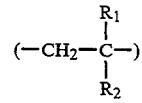

$(-CH_2-\underset{R_2}{\overset{R_1}{C}}-)$ in which:
R₁ is H or alkyl;
R₂ is phenyl, CO₂R₃ or macromer; and
R₃ is H or alkyl which is unsubstituted or substituted with one or more hydroxy groups,
(II) a monomeric component containing at least two ethylenically unsaturated groups,
(III) a photoinitiator or photoinitiator system, and
(IV) a thermal crosslinking agent,
(d) cover film,
wherein
the adhesion of said first layer (b) to said second layer (c) is greater than the adhesion between said first layer (b) and said support film (a); the adhesion of said first layer (b) to said second layer (c) is greater than the adhesion between said second layer (c) and said cover film; and the adhesion between said first layer (b) and said support film (a) is greater than the adhesion between said second layer (c) and said cover film.

2. The permanent coating element of claim 1 wherein said first layer (b) further comprises a carboxyl containing copolymer cobinder.

3. The permanent coating element of claim 2 wherein the copolymer cobinder consists essentially of a carboxyl containing copolymeric binder, wherein the level of carboxyl groups is determined for a given composition by optimizing the amount needed for good development in aqueous alkaline developer, having structural units:

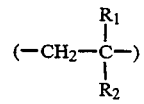

in which:
R₁ is H or alkyl;
R₂ is phenyl, CO₂R₃ or macromer; and
R₃ is H or alkyl which is unsubstituted or substituted with one or more hydroxy groups.

4. The permanent coating element of claim 1 wherein the first layer further comprises a thermal crosslinking agent.

5. The permanent coating element of claim 1 wherein said thermal crosslinking agent is selected from the group consisting of an adduct of a polyisocyanate and an isocyanate-group blocking agent, a formaldehyde condensation product with melamine, and a formaldehyde condensation product with urea, the hydroxyl groups of the formaldehyde condensation product unsubstituted or having substitution with ether groups 6. The permanent coating element of claim 1 wherein said macromer component has a weight average molecular weight of about 5,000 or less and a polydispersity of about 3 or less.

7. The permanent coating element of claim 1 wherein the first or second layer further comprises an inorganic filler.

8. The permanent coating element of claim 7 wherein the inorganic filler is aminosilane treated talc.

* * * * *